(12) United States Patent
Kim et al.

(10) Patent No.: US 10,790,213 B2
(45) Date of Patent: Sep. 29, 2020

(54) HEAT RADIATION DEVICE, SEMICONDUCTOR PACKAGE COMPRISING THE SAME, AND SEMICONDUCTOR DEVICE COMPRISING THE SAME

(71) Applicant: SAMSUNG ELECTRONICS CO., LTD., Suwon-si, Gyeonggi-do (KR)

(72) Inventors: Jae Choon Kim, Incheon (KR); Young-Deuk Kim, Hwaseong-si (KR); Younghoon Hyun, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/139,526

(22) Filed: Sep. 24, 2018

(65) Prior Publication Data
US 2019/0287877 A1 Sep. 19, 2019

(30) Foreign Application Priority Data
Mar. 13, 2018 (KR) ........................ 10-2018-0029202

(51) Int. Cl.
*H01L 23/367* (2006.01)
*H01L 29/41* (2006.01)
*H01L 23/00* (2006.01)

(52) U.S. Cl.
CPC ............ *H01L 23/367* (2013.01); *H01L 24/09* (2013.01); *H01L 29/41* (2013.01)

(58) Field of Classification Search
CPC ........ H01L 23/367; H01L 24/09; H01L 29/41
See application file for complete search history.

(56) References Cited

U.S. PATENT DOCUMENTS

| 7,924,569 | B2 | 4/2011 | Letz |
| 8,310,046 | B2 | 11/2012 | Baek et al. |
| 8,546,924 | B2 | 10/2013 | Yu et al. |
| 9,226,763 | B2 | 1/2016 | Kim et al. |
| 9,671,141 | B2 | 6/2017 | Kim et al. |
| 2010/0163090 | A1* | 7/2010 | Liu ..................... H01L 23/3675 136/224 |
| 2012/0153445 | A1* | 6/2012 | Son ....................... H01L 23/318 257/668 |

(Continued)

FOREIGN PATENT DOCUMENTS

| JP | 4817543 | 11/2011 |
| KR | 10-2013-0061487 | 8/2013 |
| KR | 10-2016-0092305 | 8/2016 |

OTHER PUBLICATIONS

Jaeho Lee, et al., "Investigation of phonon coherence and backscattering using silicon nanomeshes," Nature Communications, Published Jan. 4, 2017, (pp. 1-8).

(Continued)

*Primary Examiner* — Christine A Enad
(74) *Attorney, Agent, or Firm* — F. Chau & Associates, LLC

(57) ABSTRACT

A heat radiation device includes a semiconductor substrate. A first electrode is disposed on the semiconductor substrate. A second electrode is disposed on the semiconductor substrate and is spaced apart from the first electrode. A first through electrode is disposed in the semiconductor substrate. The first through electrode is electrically connected to the first electrode.

20 Claims, 9 Drawing Sheets

(56) References Cited

U.S. PATENT DOCUMENTS

2014/0124949 A1* 5/2014 Paek ................. H01L 23/49827
 257/774
2018/0323768 A1* 11/2018 Ikeda ....................... H03H 9/13

OTHER PUBLICATIONS

Zongqing Ren, et al., "Thermal conductivity anisotropy in holey silicon nanostructures and its impact on thermoelectric cooling," IOP Publishing Nanotechnology 29 (2018) 045404 (pp. 1-6).

* cited by examiner

HEAT RADIATION DEVICE, SEMICONDUCTOR PACKAGE COMPRISING THE SAME, AND SEMICONDUCTOR DEVICE COMPRISING THE SAME

CROSS-REFERENCE TO RELATED APPLICATIONS

This U.S. nonprovisional application claims priority under 35 U.S.C. § 119 to Korean Patent Application No. 10-2018-0029202 filed on Mar. 13, 2018, in the Korean Intellectual Property Office, the entire contents of which are hereby incorporated by reference.

TECHNICAL FIELD

The present disclosure relates to heat dissipation and, more specifically to a heat radiation device, a semiconductor package comprising the same, and a semiconductor device comprising the same.

DISCUSSION OF THE RELATED ART

To accommodate more capable semiconductor chips with smaller form factors, multiple semiconductor chips have been vertically stacked on a single substrate or a package. As more semiconductor chips are stacked within a single package and as the clock speeds for these semiconductor chips increases, dissipation of heat becomes a greater challenge. Excessive heat that is not dissipated promptly may cause various malfunctions or operating speed delays.

SUMMARY

A heat radiation device includes a semiconductor substrate. A first electrode is disposed on the semiconductor substrate. A second electrode is disposed on the semiconductor substrate and is spaced apart from the first electrode. A first through electrode is disposed in the semiconductor substrate. The first through electrode is electrically connected to the first electrode.

A semiconductor package includes at least one semiconductor chip disposed on a package substrate. A heat radiation device is disposed on the at least one semiconductor chip. The heat radiation device includes a semiconductor substrate having a bottom surface adjacent to the at least one semiconductor chip and a top surface facing the bottom surface. A first electrode and a second electrode are each in contact with the semiconductor substrate and are spaced apart from each other. A first through electrode extends from the top surface of the semiconductor substrate toward the bottom surface of the semiconductor substrate.

A semiconductor device includes a semiconductor substrate having a first surface and a second surface facing each other. A plurality of circuit patterns is disposed on the first surface. An interlayer dielectric layer covers the first surface. A first electrode and a second electrode are each disposed on the second surface and are spaced apart from each other.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION OF EMBODIMENTS

Some exemplary embodiments of the present inventive concept will now be described in detail with reference to the accompanying drawings. In this description, specific terminology is employed for sake of clarity. However, the present disclosure is not intended to be limited to the specific terminology so selected, and it is to be understood that each specific element includes all technical equivalents which operate in a similar manner.

Figure 1:
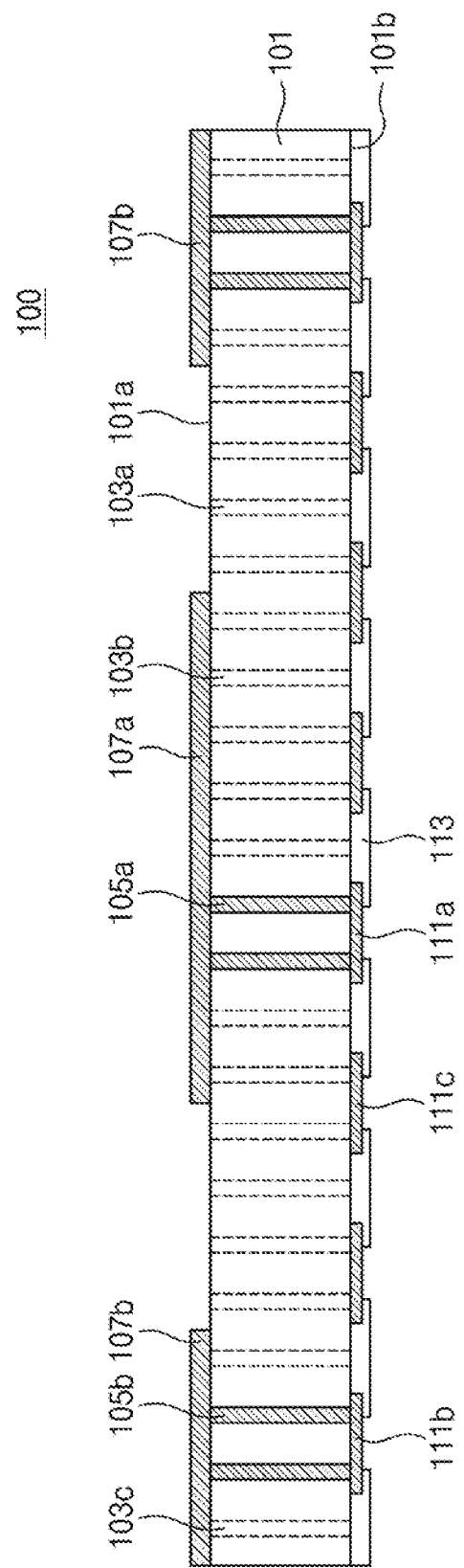
FIG. 1 is a cross-sectional view illustrating a heat radiation device according to some exemplary embodiments of the present inventive concept.
Figure 2:
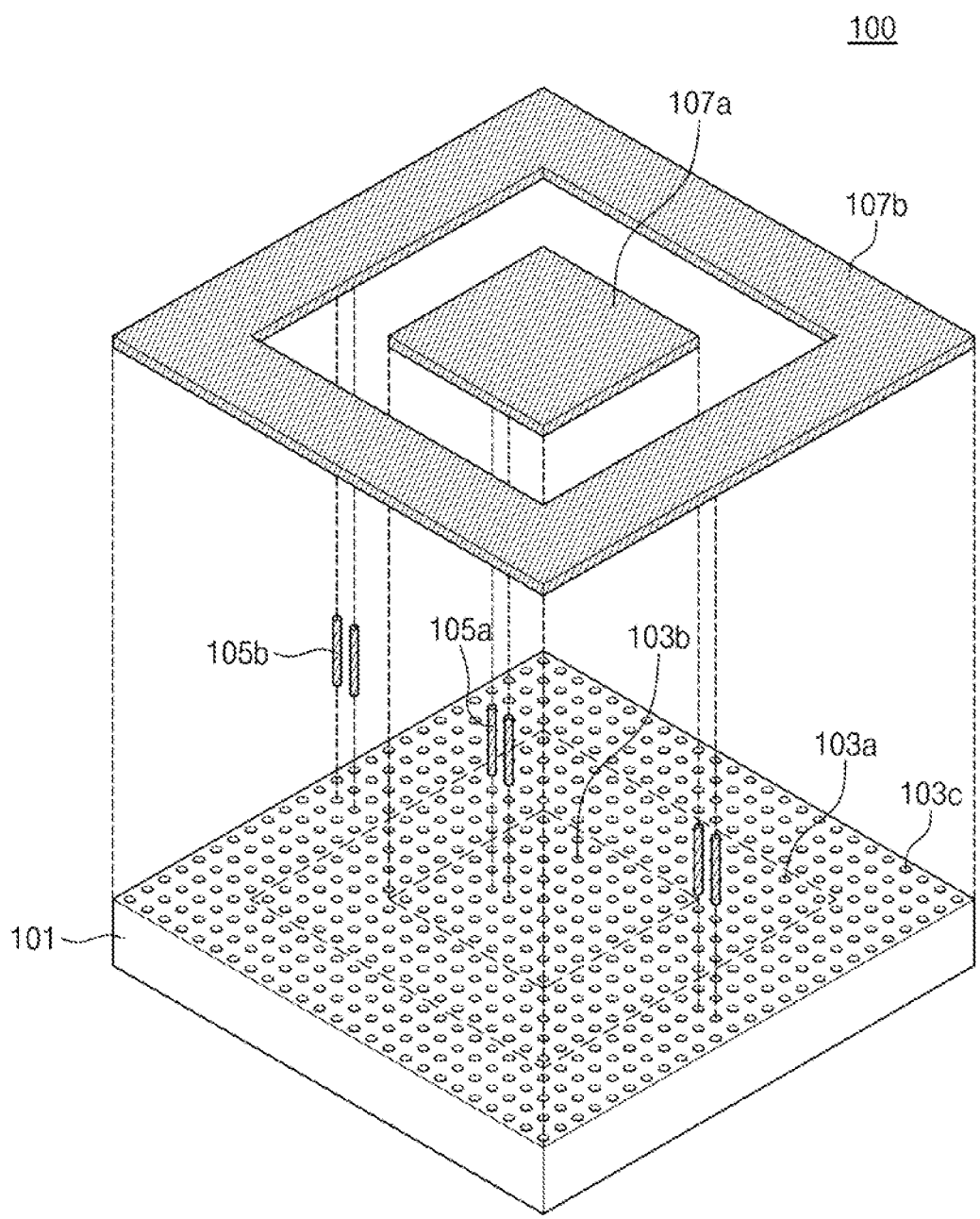
FIG. 2 is an exploded perspective view illustrating the heat radiation device of FIG. 1.

FIG. 1 is a cross-sectional view illustrating a heat radiation device according to some exemplary embodiments of the present inventive concept. FIG. 2 is an exploded perspective view illustrating the heat radiation device of FIG. 1.

Referring to FIGS. 1 and 2, a heat radiation device 100 may include a semiconductor substrate 101. The semiconductor substrate 101 may be formed of, for example, silicon. The semiconductor substrate 101 may be doped with one or more impurities (e.g. dopants). The impurities may include phosphorous, arsenic, and/or boron. The impurities may have n-type and/or p-type conductivity. The semiconductor substrate 101 may have a first surface 101a and a second surface 101b facing each other. The first surface 101a may be a top surface of the semiconductor substrate 101. The second surface 101b may be a bottom surface of the semiconductor substrate 101. A first electrode 107a and a second electrode 107b may be disposed on the first surface 101a. The first electrode 107a and the second electrode 107b may be spaced apart from each other. The first and second electrodes 107a and 107b may include metal such as copper, aluminum, and/or tungsten. The first electrode 107a may be positioned on a center of the first surface 101a. The second electrode 107b may be positioned on an edge of the first surface 101a and may surround the first electrode 107a with a rectangular frame shape.

The semiconductor substrate 101 may include a plurality of first holes 103a disposed between the first and second electrodes 107a and 107b. The semiconductor substrate 101 may also include a plurality of second holes 103b that are each covered by the first electrode 107a. The semiconductor substrate 101 may also include a plurality of third holes 103c that are each covered by the second electrode 107b. The first, second, and third holes 103a, 103b, and 103c may penetrate the semiconductor substrate 101. The first, second, and third holes 103a, 103b, and 103c may be evacuated or filled with air. Neither the first electrode 107a nor the second electrode 107b vertically overlaps the first holes 103a.

At least one first through electrode 105a and at least one second through electrode 105b may be disposed within the semiconductor substrate 101. The first and second through electrodes 105a and 105b may be spaced apart from each other. The first through electrode 105a may be electrically connected to the first electrode 107a. The second through electrode 105b may be electrically connected to the second electrode 107b. The first and second through electrodes 105a and 105b may include metal such as copper, aluminum, and/or tungsten. An insulation layer may be interposed between the semiconductor substrate 101 and each of the first and second through electrodes 105a and 105b.

A plurality of first, second, and third conductive pads 111a, 111b, and 111c are spaced apart from each other on the second surface 101b of the semiconductor substrate 101. The first conductive pad 111a may be in contact with the first through electrode 105a. The second conductive pad 111b may be in contact with the second through electrode 105b. The second surface 101b may be at least partially covered with a passivation layer 113.

The heat radiation device 100 may be configured in such a way that the first and second electrodes 107a and 107b may be supplied with voltages different from each other, and as a result, the first electrode 107a may have a temperature different from that of the second electrode 107b.

For example, the second electrode 107b may be supplied with a second voltage and the first electrode 107a may be supplied with a first voltage that is greater than the second voltage. The first voltage may be positive, and the second voltage may be zero or negative. When the first and second electrodes 107a and 107b are supplied with different voltages, a thermoelectric or Peltier effect may occur in which electrons flow through the semiconductor substrate 101 while transferring heat. Therefore, the first electrode 107a may decrease in temperature, and the second electrode 107b may increase in temperature. In contrast, when the first voltage is less than the second voltage, the first electrode 107a may increase in temperature and the second electrode 107b may decrease in temperature. The first, second, and third holes 103a, 103b, and 103c may have an adiabatic function to prevent heat transfer therethrough between the first electrode 107a and the second electrode 107b.

A direction of the flow of heat in the heat radiation device 100 may be parallel to a plane of the first surface 101a or the second surface 101b. The heat radiation device 100, according to exemplary embodiments of the present inventive concept, may use this thermoelectric or Peltier effect to move heat generated from semiconductor chips toward an edge or another desired position of the heat radiation device 100. The heat so moved may then be promptly discharged, and thus malfunction or operating speed delay of semiconductor devices caused by excessive heat may be minimized or prevented.

The heat radiation device 100 may be a holey or porous silicon substrate exhibiting the thermoelectric effect.

A method of fabricating the heat radiation device 100 will now be described. First, a single crystalline silicon wafer may be doped with impurities and then the wafer may be etched to form the first, second, and third holes 103a, 103b, and 103c. Plating and etching processes may be performed to form the first through electrode 105a in one of the second holes 103b and also to form the second through electrode 105b in one of the third holes 103c. Deposition and etching processes may be performed to form the first electrode 107a, the second electrode 107b, and the first, second, and third conductive pads 111a, 111b, and 111c.

Figure 3:
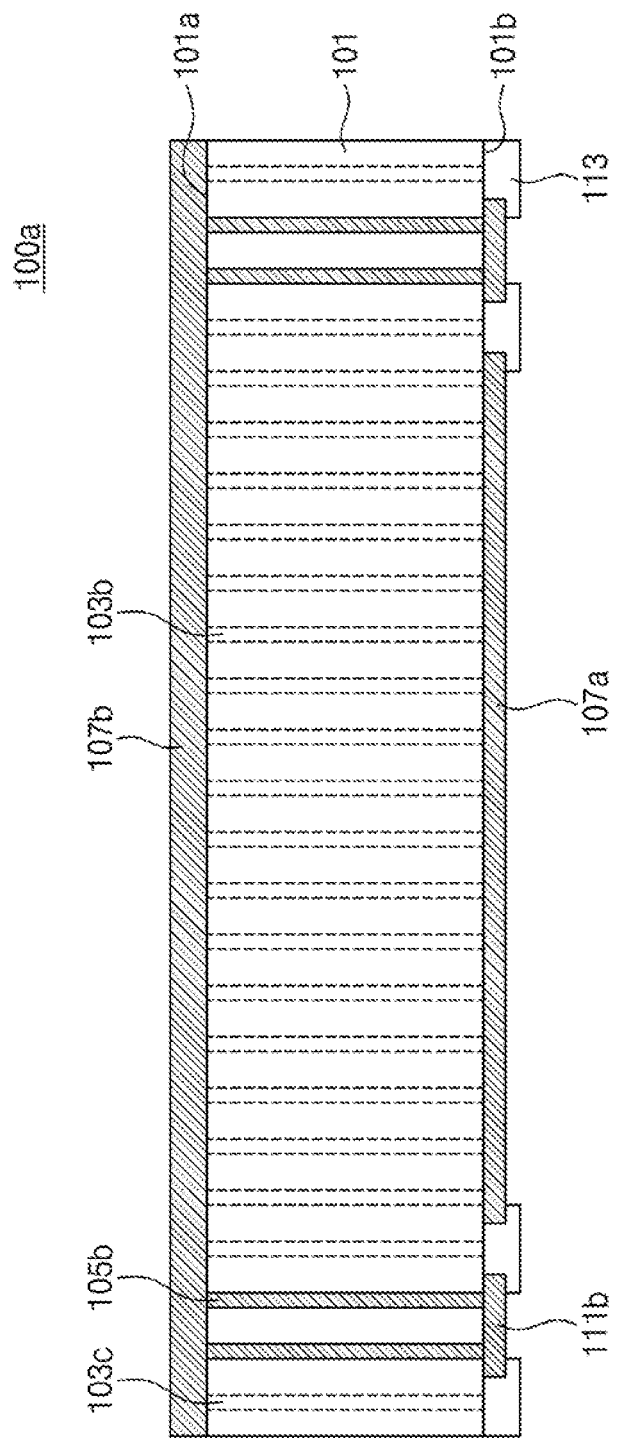
FIG. 3 is a cross-sectional view illustrating a heat radiation device according to some exemplary embodiments of the present inventive concept.

FIG. 3 is a cross-sectional view illustrating a heat radiation device according to some exemplary embodiments of the present inventive concept.

Referring to FIG. 3, a heat radiation device 100a, according to exemplary embodiments of the present inventive concept, may be configured in such a way that the first electrode 107a is disposed on the second surface 101b of the semiconductor substrate 101 and the second electrode 107b is disposed on the first surface 101a of the semiconductor substrate 101. The heat radiation device 100a may omit the first through electrode 105a, the first holes 103a, the first conductive pad 111a, and the third conductive pad 111c that are shown in FIGS. 1 and 2. The heat radiation device 100a may have a vertical thickness that is greater than that of the heat radiation device 100 of FIGS. 1 and 2. Other configurations, voltage supply, and temperature may be identical or similar to those discussed above with reference to FIGS. 1 and 2. A direction of the flow of heat in the heat radiation device 100a may be perpendicular to the first surface 101a or the second surface 101b.

Figure 4:
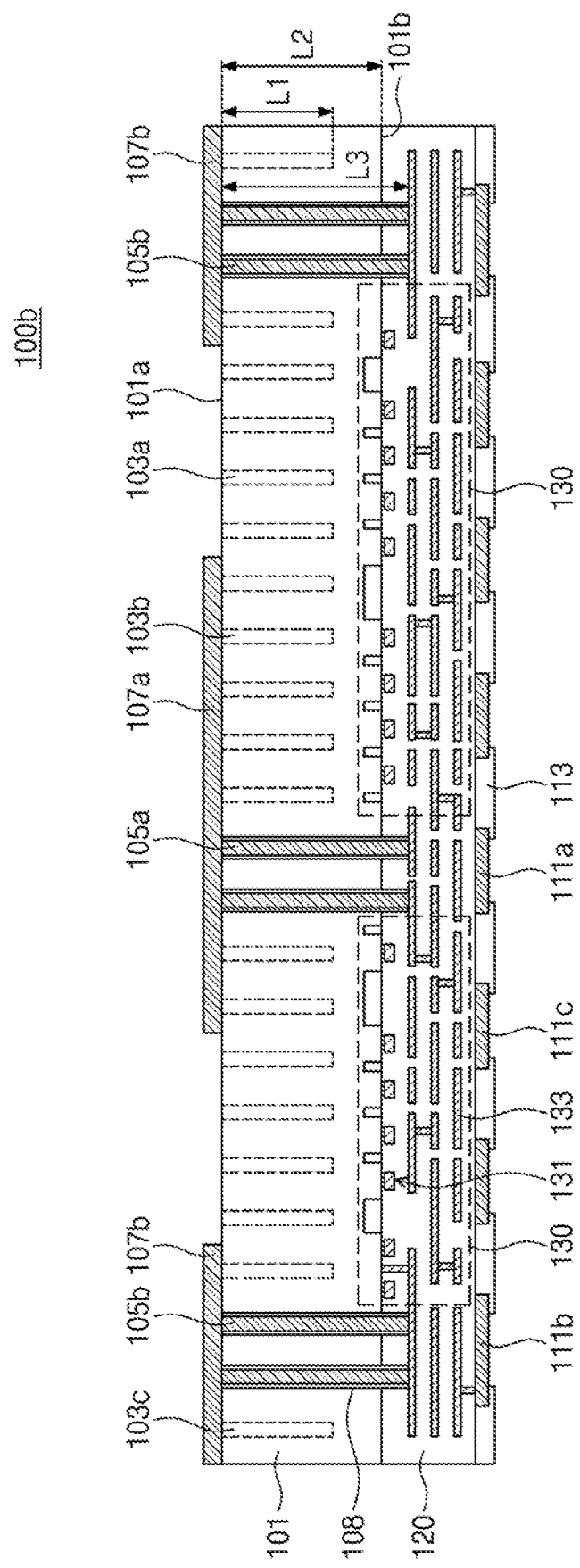
FIG. 4 is a cross-sectional view illustrating a heat radiation device according to some exemplary embodiments of the present inventive concept.

FIG. 4 is a cross-sectional view illustrating a heat radiation device according to some exemplary embodiments of the present inventive concept.

Referring to FIG. 4, a heat radiation device 100b, according to exemplary embodiments of the present inventive concept, may further include circuit patterns 130 disposed on the second surface 101b of the semiconductor substrate 101 and an interlayer dielectric layer 120 covering the circuit patterns 130. The circuit patterns 130 may include transistors 131 and wiring lines 133. Each of the first, second, and third holes 103a, 103b, and 103c may have a first vertical length L1 that is less than a second vertical length L2 of the semiconductor substrate 101. Each of the first and second through electrodes 105a and 105b may have a third vertical length L3 that is greater than the second vertical length L2 of the semiconductor substrate 101. The first and second through electrodes 105a and 105b may each penetrate the semiconductor substrate 101 and may extend into the interlayer dielectric layer 120, thereby being electrically connected to the wiring lines 133. A via insulation layer 108 may be interposed between the semiconductor substrate 101 and each of the first and second through electrodes 105a and 105b. The first electrode 107a and the second electrode 107b may be spaced apart from each other on the first surface 101a. The first, second, and third conductive pads 111a, 111 b, and 111c may be disposed on the interlayer dielectric layer 120. The interlayer dielectric layer 120 may be covered with the passivation layer 113. Other configurations may be identical or similar to those discussed above with reference to FIGS. 1 and 2.

The heat radiation device 100b may be configured to move generated heat when the first and second electrodes 107a and 107b have different temperatures due to the difference in voltage between the first and second electrodes 107a and 107b, as discussed above with reference to FIGS. 1 and 2. In addition, the heat radiation device 100b may be a semiconductor device that performs a memory function and/or a logic function achieved by the circuit patterns 130. The heat radiation device 100b may use the aforementioned thermoelectric or Peltier effect to move heat from the circuit patterns 130 toward desired positions.

Figure 5:
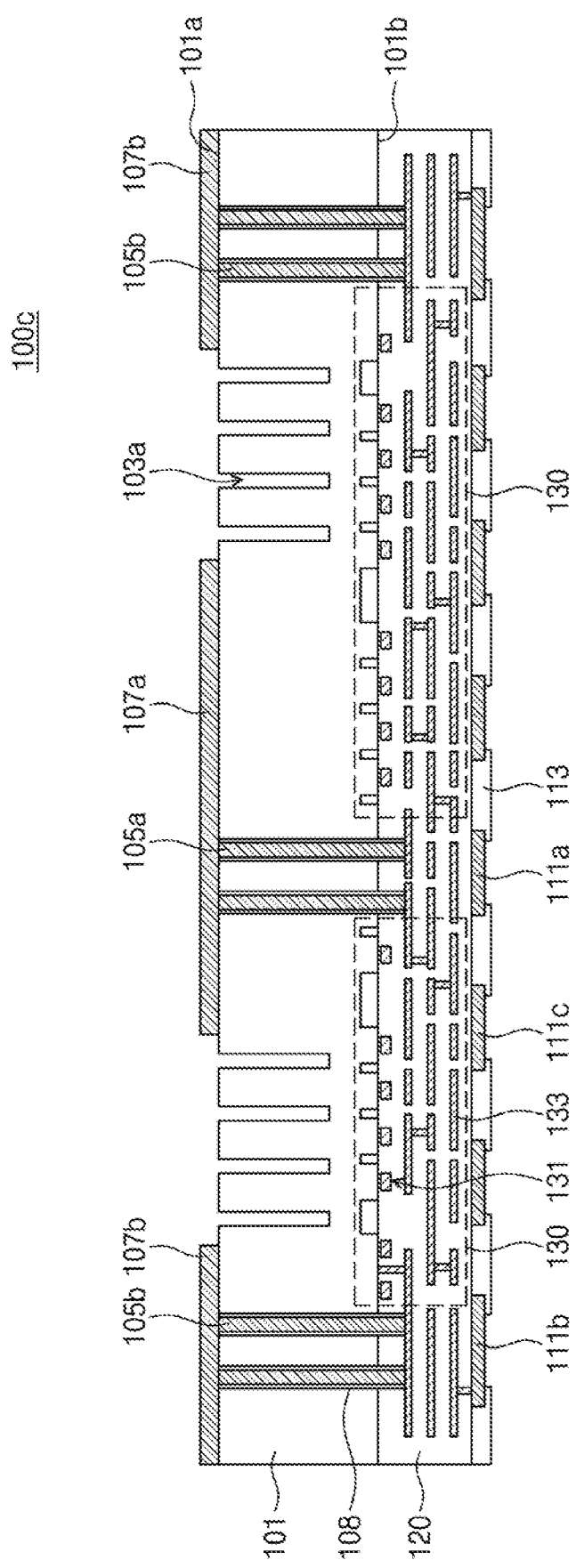
FIG. 5 is a cross-sectional view illustrating a heat radiation device according to some exemplary embodiments of the present inventive concept.

FIG. 5 is a cross-sectional view illustrating a heat radiation device according to some exemplary embodiments of the present inventive concept.

Referring to FIG. 5, a heat radiation device 100c, according to exemplary embodiments of the present inventive concept, may omit the second holes 103b of FIG. 4 and the third holes 103c of FIG. 4. Other configurations may be identical or similar to those discussed above with reference to FIG. 5.

Various semiconductor packages including the heat radiation devices 100, 100a, 100b, and 100c will now be described.

Figure 6:
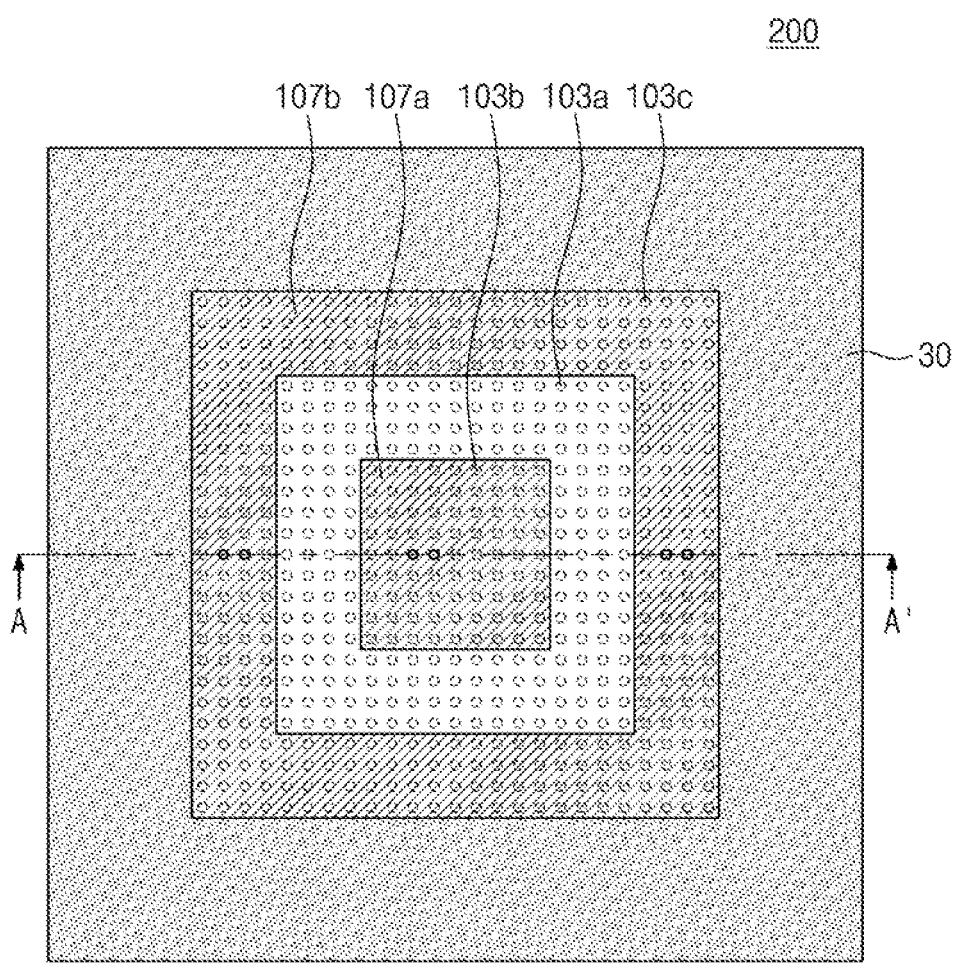
FIG. 6 is a plan view illustrating a semiconductor package according to some exemplary embodiments of the present inventive concept.
Figure 7:
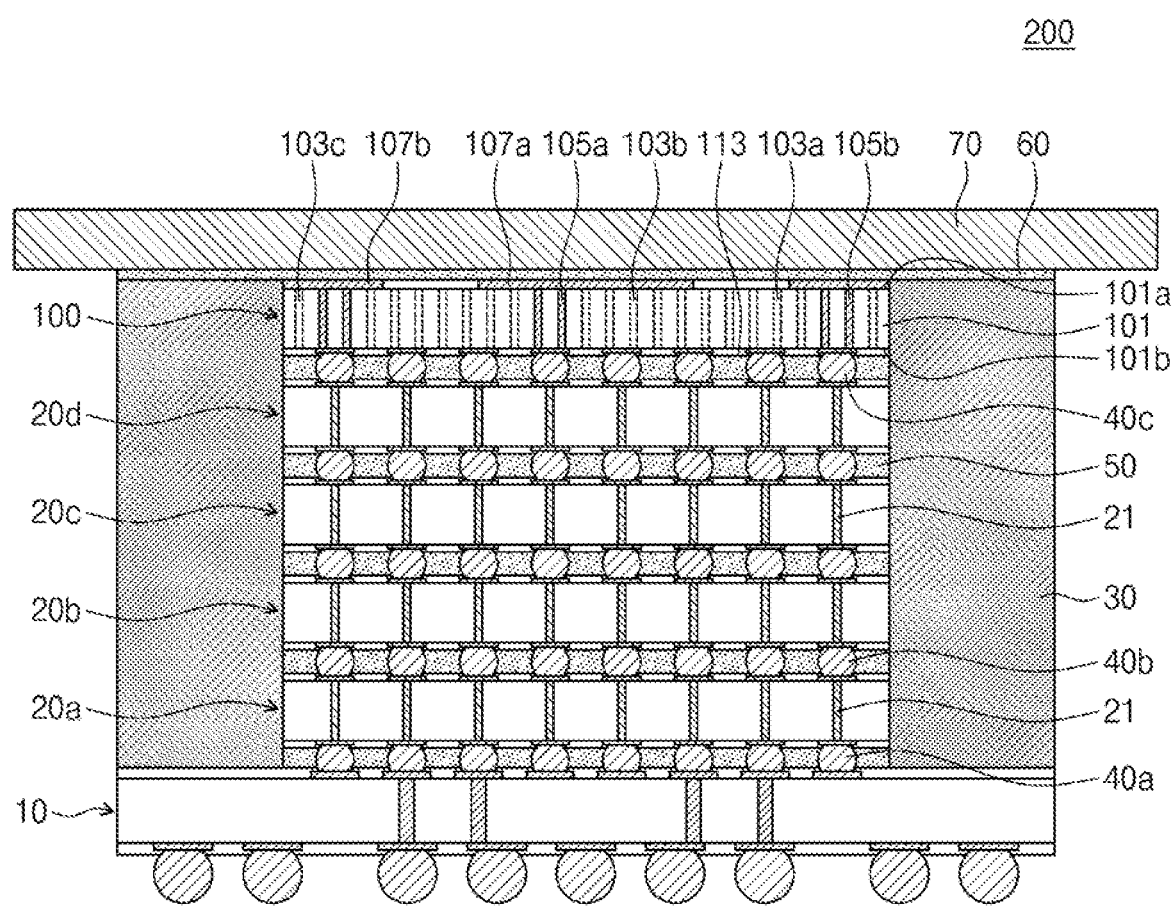
FIG. 7 is a cross-sectional view taken along line A-A' of FIG. 6.

FIG. 6 is a plan view illustrating a semiconductor package according to some exemplary embodiments of the present inventive concept. FIG. 7 is a cross-sectional view taken along line A-A' of FIG. 6.

Referring to FIGS. 6 and 7, first, second, third, and fourth semiconductor chips 20a, 20b, 20c, and 20d may be sequentially stacked on a package substrate 10. The package substrate 10 may be electrically connected through first solder balls 40a to the first semiconductor chip 20a positioned at the bottom of the stack of the first, second, third, and fourth semiconductor chips 20a, 20b, 20c, and 20d. The first, second, third, and fourth semiconductor chips 20a, 20b, 20c, and 20d may be electrically connected to each other through second solder balls 40b interposed therebetween. The first, second, third, and fourth semiconductor chips 20a, 20b, 20c, and 20d may be the same chip as each other or different chips from each other. One or more of the first, second, third, and fourth semiconductor chips 20a, 20b, 20c, and 20d may be a memory chip. One or more of the first, second, third, and fourth semiconductor chips 20a, 20b, 20c, and 20d may be a logic chip. Each of the first, second, third, and fourth semiconductor chips 20a, 20b, 20c, and 20d may be provided therein with chip through electrodes 21.

The heat radiation device 100 may be disposed on the fourth semiconductor chip 20d and may be positioned at the top of the stack of the first, second, third, and fourth semiconductor chips 20a, 20b, 20c, and 20d. A description of the heat radiation device 100 may be identical or similar to that discussed above with reference to FIGS. 1 and 2. The heat radiation device 100 and the fourth semiconductor chip 20d may be electrically connected to each other through third solder balls 40c interposed therebetween.

Under-fill layers 50 may fill spaces between the package substrate 10 and the first semiconductor chip 20a, between the first, second, third, and fourth semiconductor chips 20a, 20b, 20c, and 20d, and between the fourth semiconductor chip 20d and the heat radiation device 100. The heat radiation device 100 may have a sidewall vertically aligned with sidewalls of the first, second, third, and fourth semiconductor chips 20a, 20b, 20c, and 20d. The package substrate 10 may be covered on ends of its top surface with a mold layer 30 laterally surrounding and protecting the first, second, third, and fourth semiconductor chips 20a, 20b, 20c, and 20d. The mold layer 30 may be in contact with the sidewalls of the first, second, third, and fourth semiconductor chips 20a, 20b, 20c, and 20d, the sidewall of the heat radiation device 100, and sidewalls of the under-fill layers 50. The mold layer 30 may have a top surface that is coplanar with that of the second electrode 107b of the heat radiation device 100. The heat radiation device 100 may have a vertical thickness that is identical or similar to that of each of the first, second, third and fourth semiconductor chips 20a, 20b, 20c, and 20d.

A heat radiation plate 70 may be disposed on the heat radiation device 100 and may be configured to dissipate heat received from the heat radiation device 100. The heat radiation plate 70 may be a metal plate or a flexible metal tape. The heat radiation plate 70 may be adhered through an adhesive layer 60 to the heat radiation device 100 and the top surface of the mold layer 30.

When the first electrode 107a is supplied with a voltage greater than that applied to the second electrode 107b, the first electrode 107a may decrease in temperature (i.e. may be cooled) and the second electrode 107b may increase in temperature (i.e. may be heated). Heat generated from the first, second, third, and fourth semiconductor chips 20a, 20b, 20c, and 20d may be transferred through the second and third solder balls 40b and 40c to the heat radiation device 100. When the first and second electrodes 107a and 107b are supplied with different voltages, central regions of the first, second, third, and fourth semiconductor chips 20a, 20b, 20c, and 20d may become hotter than other regions. Since the first electrode 107a of the heat radiation device 100 has a relatively low temperature, it may be possible to promptly remove or cool down the heat generated from the first, second, third, and fourth semiconductor chips 20a, 20b, 20c, and 20d. It may also be possible to move the heat from the first, second, third, and fourth semiconductor chips 20a, 20b, 20c, and 20d toward an edge of the heat radiation device 100. Thereafter, the heat radiation plate 70 may release the heat to the outside.

Figure 8:
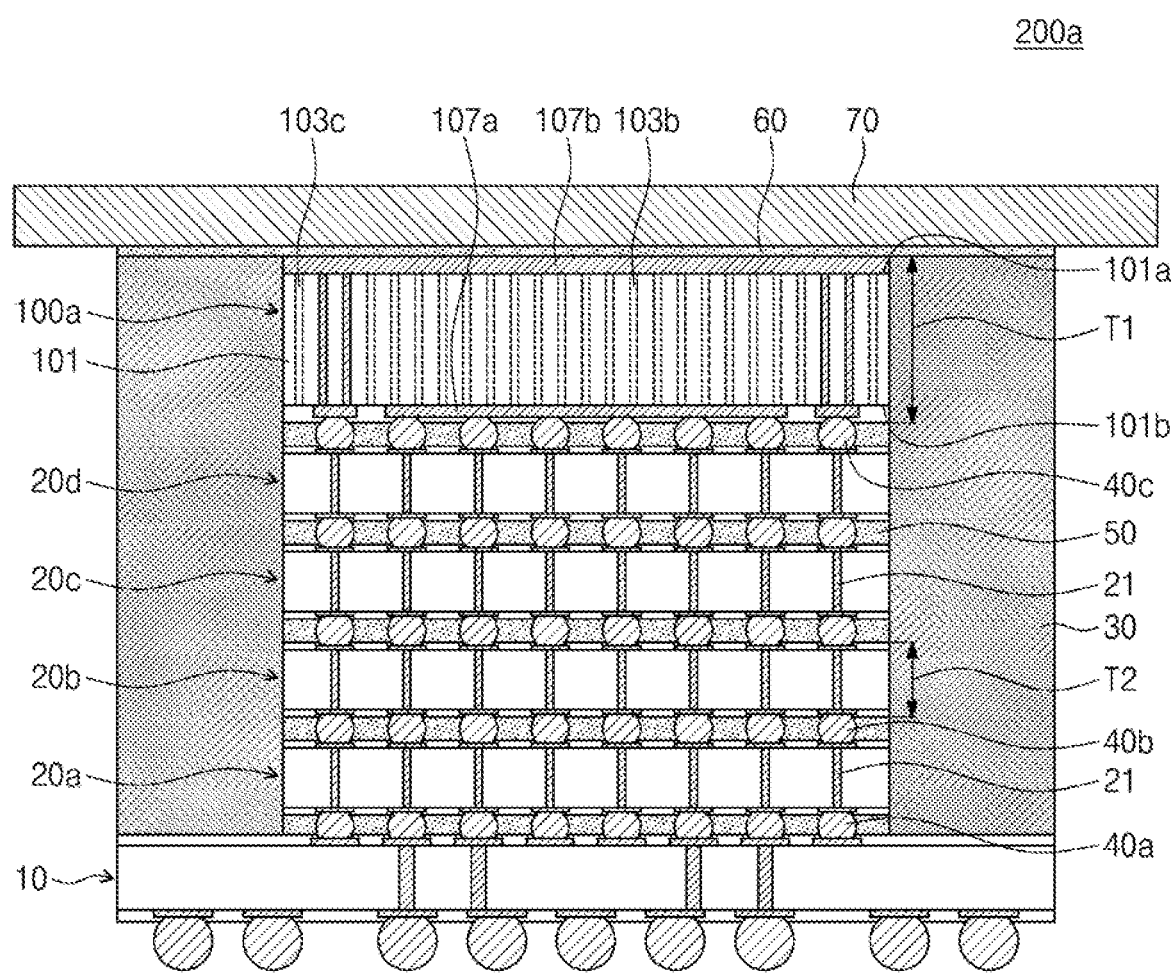
FIG. 8 is a cross-sectional view illustrating a semiconductor package according to some exemplary embodiments of the present inventive concept.

FIG. 8 is a cross-sectional view illustrating a semiconductor package according to some exemplary embodiments of the present inventive concept.

Referring to FIG. 8, a semiconductor package 200a, according to exemplary embodiments of the present inventive concept, may include the heat radiation device 100a discussed above with reference to FIG. 3. For example, the heat radiation device 100a of FIG. 3 may be disposed on the fourth semiconductor chip 20d. The heat radiation device 100a may have a first thickness T1 that is greater than a second thickness T2 of the second semiconductor chip 20b. When the first electrode 107a is supplied with a voltage greater than that applied to the second electrode 107b, the first electrode 107a may decrease in temperature (i.e. may be cooled) and the second electrode 107b may increase in temperature (i.e. may be heated). Heat generated from the first, second, third, and fourth semiconductor chips 20a, 20b, 20c, and 20d may be transferred through the second and third solder balls 40b and 40c to the first electrode 107a, with the result that the first electrode 107a may remove the heat and cool down the first, second, third, and fourth semiconductor chips 20a, 20b, 20c, and 20d.

Either the heat radiation device 100b of FIG. 4 or the heat radiation device 100c of FIG. 5 may replace the heat radiation device 100 in the semiconductor package 200 of FIGS. 6 and 7. In FIGS. 7 and 8, although four semiconductor chips are shown as being stacked, the present invention may still be implemented with a single semiconductor chip, with two or three stacked semiconductor chips, or with more than 4 stacked semiconductor chips. The heat radiation plate 70 may be omitted from either the semiconductor package 200 or the semiconductor package 200a.

Figure 9:
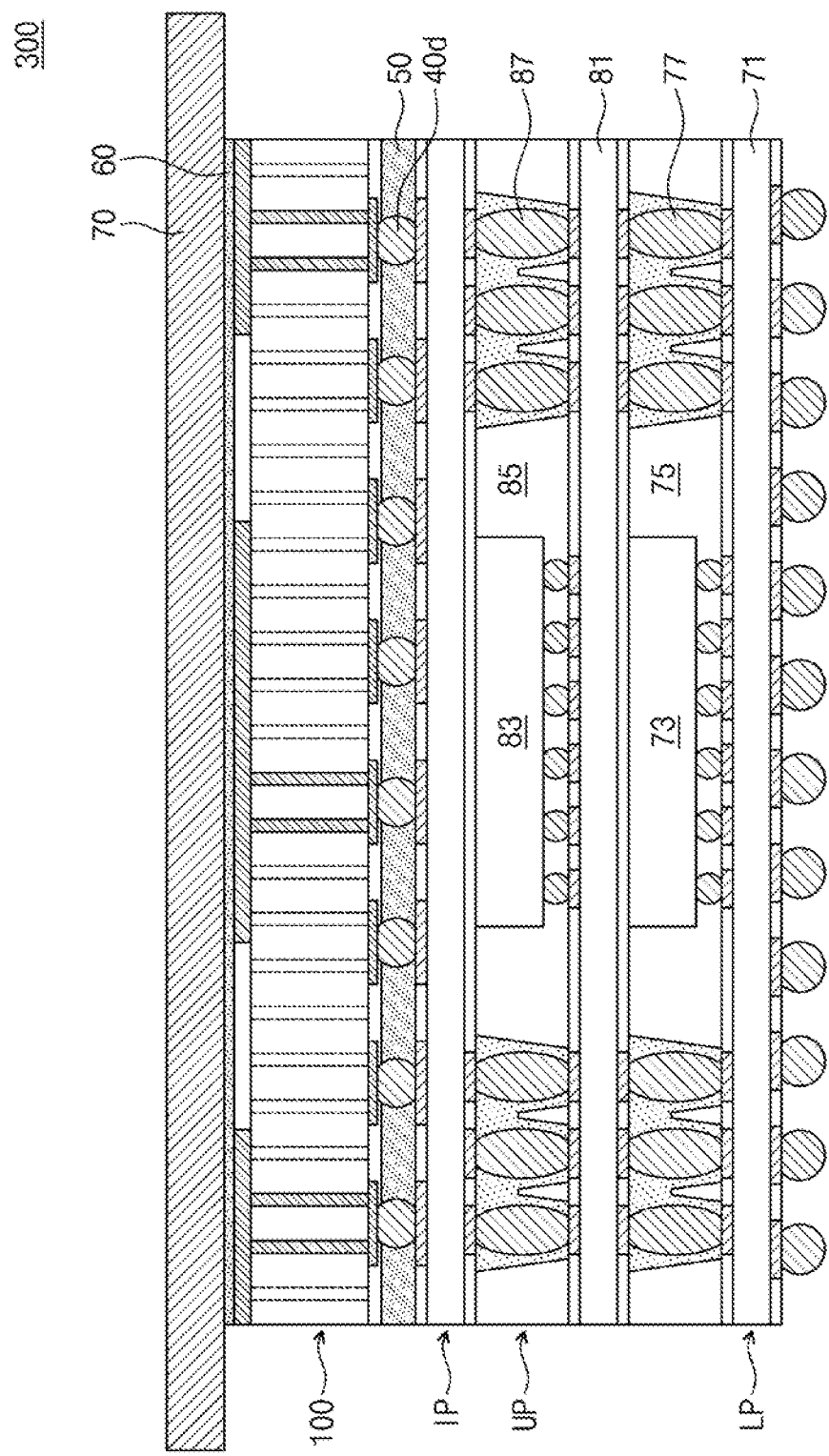
FIG. 9 is a cross-sectional view illustrating a semiconductor package according to some exemplary embodiments of the present inventive concept.

FIG. 9 is a cross-sectional view illustrating a semiconductor package according to some exemplary embodiments of the present inventive concept.

Referring to FIG. 9, a semiconductor package 300, according to exemplary embodiments of the present inventive concept, may have a package-on-package structure. For example, the semiconductor package 300 may include a lower semiconductor package LP and an upper semiconductor package UP mounted on the lower semiconductor package LP. The lower semiconductor package LP may include a lower package substrate 71 and a lower semiconductor chip 73 flip-chip bonded to the lower package substrate 71. The lower semiconductor chip 73 and the lower package substrate 71 may be covered with a lower mold layer 75. A lower connection member 77 may be included within the lower mold layer 75. The upper semiconductor package UP may include an upper package substrate 81 and an upper semiconductor chip 83 flip-chip bonded to the upper package substrate 81. The upper semiconductor chip 83 and the upper package substrate 81 may be covered with an upper mold layer 85. An upper connection member 87 may be included within the upper mold layer 85. An interposer substrate IP may be mounted on the upper semiconductor package UP.

The lower connection member 77 may electrically connect the lower package substrate 71 to the upper package substrate 81, through the lower mold layer 75. The upper connection member 87 may electrically connect the upper package substrate 81 to the interposer substrate IP, through the upper mold layer 85. The interposer substrate IP may be provided thereon with, for example, the heat radiation device 100 discussed above with reference to FIGS. 1 and 2. The heat radiation device 100 may be electrically connected through solder balls 40*d* to the interposer substrate IP. The under-fill layer 50 may be interposed between the interposer substrate IP and the heat radiation device 100. The heat radiation plate 70 may be adhered through the adhesive layer 60 onto the heat radiation device 100. The heat radiation device 100 may promptly cool down heat generated in the lower and upper semiconductor packages LP and UP.

According to some exemplary embodiments of the present inventive concept, a heat radiation device, a semiconductor package, and a semiconductor device may be configured such that heat may be promptly discharged to the outside and thus it may be possible to reduce or eliminate malfunctions and/or operating speed delays that may otherwise be caused by excessive heat.

What is claimed is:

1. A beat radiation device, comprising:
   a semiconductor substrate;
   a first electrode disposed on the semiconductor substrate;
   a second electrode disposed on the semiconductor substrate and spaced apart from the first electrode on all sides thereof; and
   a first through electrode disposed in the semiconductor substrate, the first through electrode electrically connected to the first electrode,
   wherein the second electrode forms a closed frame shape in a plan view and the first electrode is disposed within the closed frame shape of the second electrode, and
   wherein the first electrode and the second electrode share a plane and the first electrode is not electrically connected to the second electrode within the shared plane.

2. The heat radiation device of claim 1, wherein the semiconductor substrate further comprises a plurality of holes disposed therein between the first electrode and the second electrode.

3. The heat radiation device of claim 1, wherein: the first electrode is disposed on a center of a first surface of the semiconductor substrate, and the second electrode is arranged along an edge of the first surface of the semiconductor substrate.

4. The heat radiation device of claim 3, further comprising a second through electrode disposed in the semiconductor substrate, the second through electrode electrically connected to the second electrode.

5. The heat radiation device of claim 1, further comprising a first conductive pad disposed on a second surface of the semiconductor substrate, wherein the first electrode is disposed on a first surface of the semiconductor substrate, opposite to the second surface, and the first through electrode connects the first electrode to the first conductive pad.

6. The heat radiation device of claim 1, wherein the first electrode is disposed on a first surface of the semiconductor substrate.

7. A semiconductor package, comprising:
   at least one semiconductor chip disposed on a package substrate; and
   a heat radiation device disposed on the at least one semiconductor chip,
   wherein the heat radiation device comprises:
      a semiconductor substrate comprising a bottom surface adjacent to the at least one semiconductor chip and a top surface facing the bottom surface;
      a first electrode and a second electrode that are each in contact with the semiconductor substrate and spaced apart from each other; and
      a first through electrode extending from the top surface of the semiconductor substrate toward the bottom surface of the semiconductor substrate,
   wherein the second electrode forms a dosed frame shape in a plan view and the first electrode is disposed within the closed frame shape of the second electrode, and
   wherein the first electrode is not directly electrically connected to the second electrode.

8. The semiconductor package of claim 7, wherein the semiconductor substrate comprises a plurality of holes each of which is disposed between the first electrode and the second electrode.

9. The semiconductor package of claim 7, wherein:
   the heat radiation device further comprises a first conductive pad disposed on the bottom surface of the semiconductor substrate;
   the first electrode is disposed on the top surface of the semiconductor substrate; and
   the first through electrode connects the first electrode to the first conductive pad.

10. The semiconductor package of claim 7, wherein: the first electrode is disposed on a center of the top surface of the semiconductor substrate, and the second electrode is arranged along an edge of the top surface of the semiconductor substrate.

11. The semiconductor package of claim 10, wherein the heat, radiation device, further comprises a second through electrode disposed in the semiconductor substrate and electrically connected to the second electrode.

12. The semiconductor package of claim 7, wherein: the first electrode is disposed on the top surface of the semiconductor substrate, and the second electrode is disposed on the bottom surface of the semiconductor substrate.

13. The semiconductor package of claim 7, wherein the semiconductor substrate comprises silicon.

14. The semiconductor package of claim 7, wherein the heat radiation device further comprises:
   a plurality of circuit patterns disposed on the bottom surface of the semiconductor substrate; and
   an interlayer dielectric layer covering the circuit patterns.

15. A semiconductor device, comprising:
   a semiconductor substrate comprising a first surface and a second surface facing each other;
   a plurality of circuit patterns disposed on the first surface;
   an interlayer dielectric layer covering the first surface; and a first electrode and a second electrode each disposed on the second surface and spaced apart from each other on all sides thereof, wherein the second electrode forms a closed frame shape in a plan view and the first electrode is disposed within the closed frame shape of the second electrode, and wherein the first electrode and the second electrode share a plane and the first electrode is not electrically connected to the second electrode within the shared plane.

16. The semiconductor device of claim 15, wherein the semiconductor substrate further comprises a plurality of holes disposed therein between the first and second electrodes, each of the plurality of holes extending from the second surface toward the first surface.

17. The semiconductor device of claim 16, further comprising a first through electrode and a second through electrode, each disposed in the semiconductor substrate and electrically connected to the first electrode and the second electrode, respectfully.

18. The semiconductor device of claim 17, wherein each of the plurality of holes has a depth extending from the second surface, the depth being less than a vertical length of each of the first and second electrodes.

19. The semiconductor device of claim 17, further comprising a first conductive pad disposed on the interlayer dielectric layer, the first conductive pad being electrically connected to the first through electrode.

20. The semiconductor device of claim 15, further comprising a plurality of holes disposed in the semiconductor substrate and vertically overlapping the first electrode and the second electrode.

* * * * *